(12) United States Patent
Furukawa et al.

(10) Patent No.: US 7,276,768 B2
(45) Date of Patent: Oct. 2, 2007

(54) SEMICONDUCTOR STRUCTURES FOR LATCH-UP SUPPRESSION AND METHODS OF FORMING SUCH SEMICONDUCTOR STRUCTURES

(75) Inventors: Toshiharu Furukawa, Essex Junction, VT (US); Robert J. Gauthier, Jr., Hinesburg, VT (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/340,737

(22) Filed: Jan. 26, 2006

(65) Prior Publication Data
US 2007/0170518 A1    Jul. 26, 2007

(51) Int. Cl.
*H01L 31/00* (2006.01)
(52) U.S. Cl. .................... 257/374; 257/296
(58) Field of Classification Search ........... 257/374, 257/296
See application file for complete search history.

(56) References Cited
U.S. PATENT DOCUMENTS

| | | | |
|---|---|---|---|
| 5,536,675 A | 7/1996 | Bohr | |
| 5,658,816 A * | 8/1997 | Rajeevakumar | 438/386 |
| 6,018,174 A * | 1/2000 | Schrems et al. | 257/296 |
| 6,137,152 A | 10/2000 | Wu | |
| 6,518,641 B2 | 2/2003 | Mandelman et al. | |
| 6,905,944 B2 * | 6/2005 | Chudzik et al. | 438/435 |
| 2005/0045952 A1 | 3/2005 | Chatty et al. | |
| 2005/0085028 A1 | 4/2005 | Chatty et al. | |

OTHER PUBLICATIONS

Cannon, Ethan Harrison, et al., U.S. Appl. No. 11/360,345, filed Feb. 23, 2006.
Cannon, Ethan Harrison, et al., U.S. Appl. No. 11/330,688, filed Jan. 12, 2006.
Furukawa, Toshiharu, et al., U.S. Appl. No. 11/340,752, filed Jan. 26, 2006.
Chang, Shunhua Thomas, et al., U.S. Appl. No. 11/330,689, filed Jan. 12, 2006.

* cited by examiner

*Primary Examiner*—Roy Potter
(74) *Attorney, Agent, or Firm*—Wood, Herron & Evans, LLP

(57) ABSTRACT

Semiconductor structures and methods for suppressing latch-up in bulk CMOS devices. The semiconductor structure comprises a shaped-modified isolation region that is formed in a trench generally between two doped wells of the substrate in which the bulk CMOS devices are fabricated. The shaped-modified isolation region may comprise a widened dielectric-filled portion of the trench, which may optionally include a nearby damage region, or a narrowed dielectric-filled portion of the trench that partitions a damage region between the two doped wells. Latch-up may also be suppressed by providing a lattice-mismatched layer between the trench base and the dielectric filler in the trench.

8 Claims, 10 Drawing Sheets

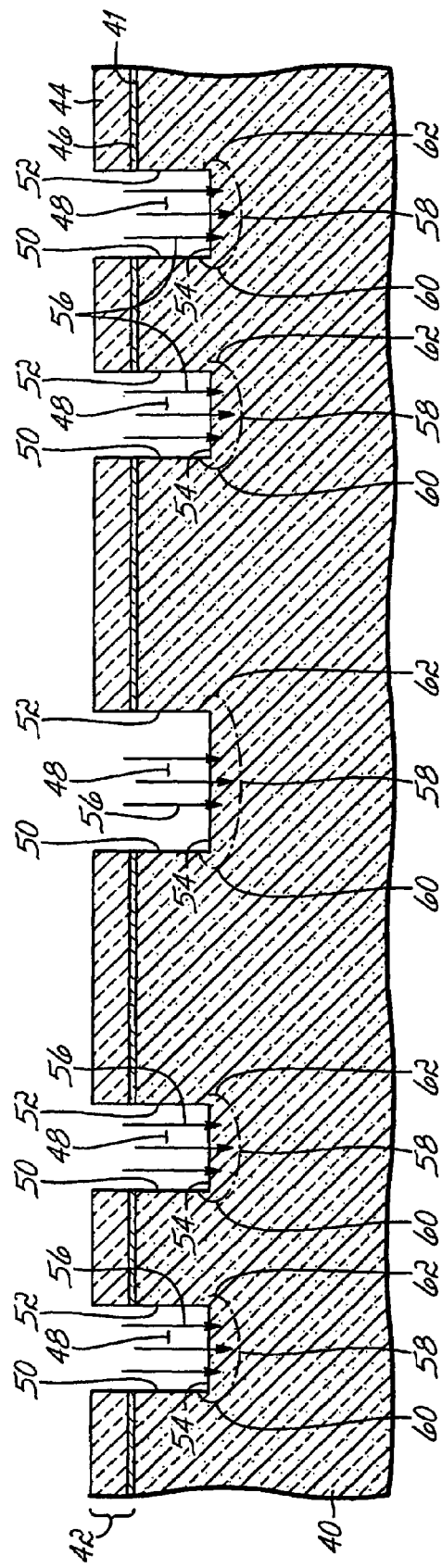
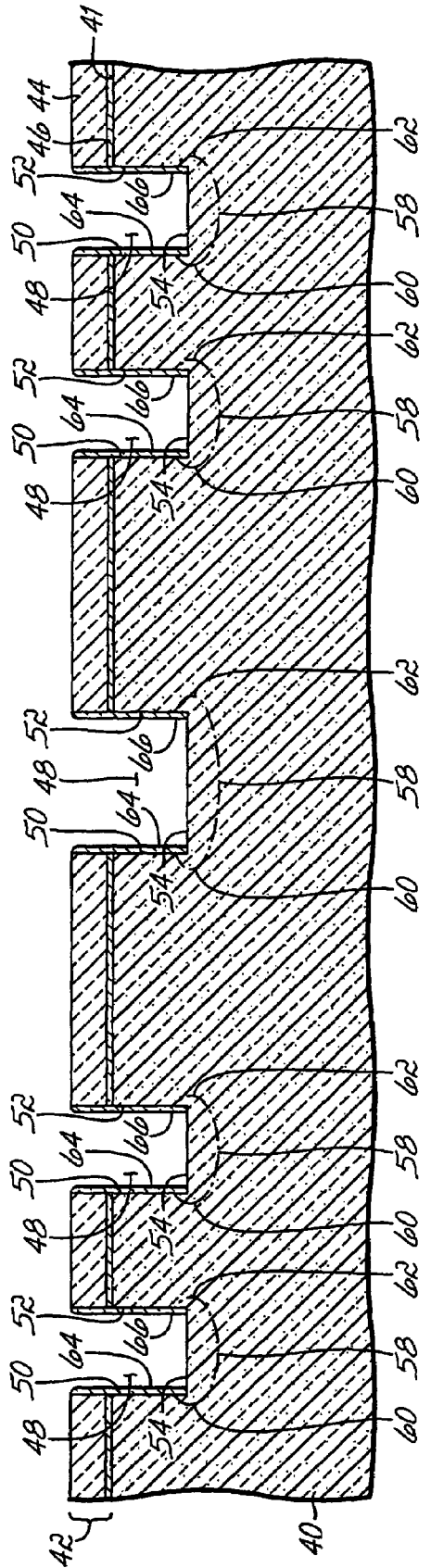
FIG. 2
FIG. 3

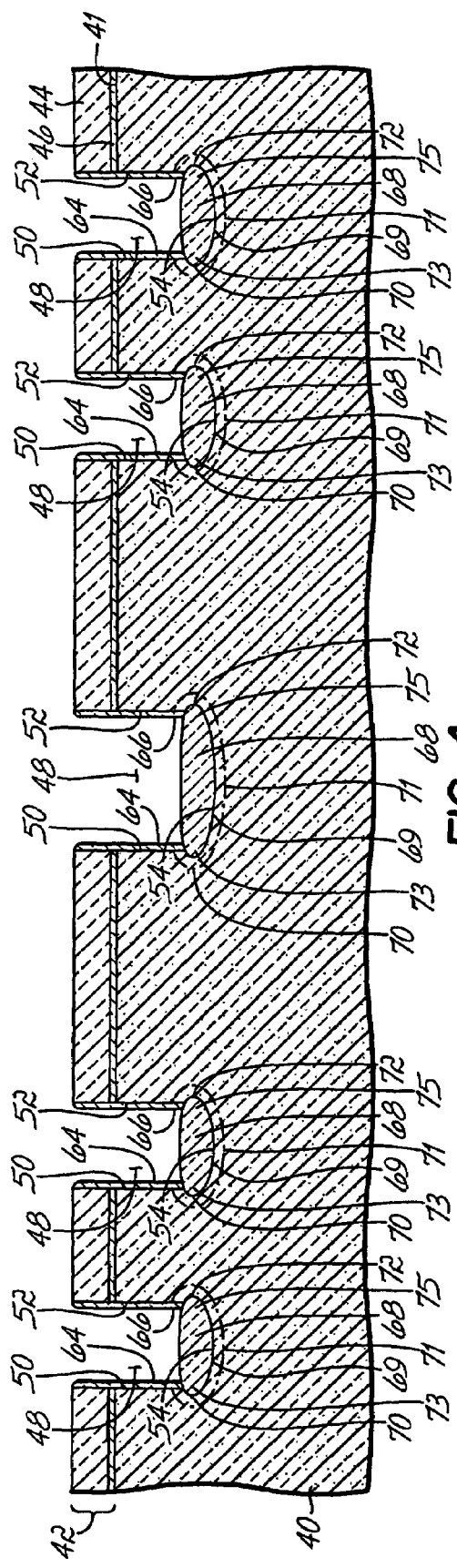

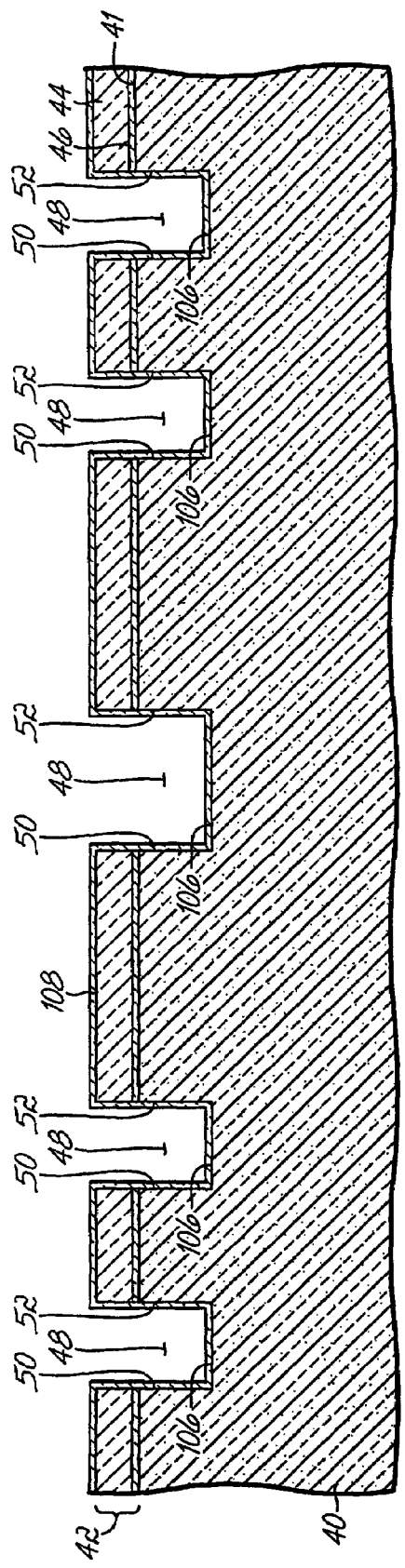
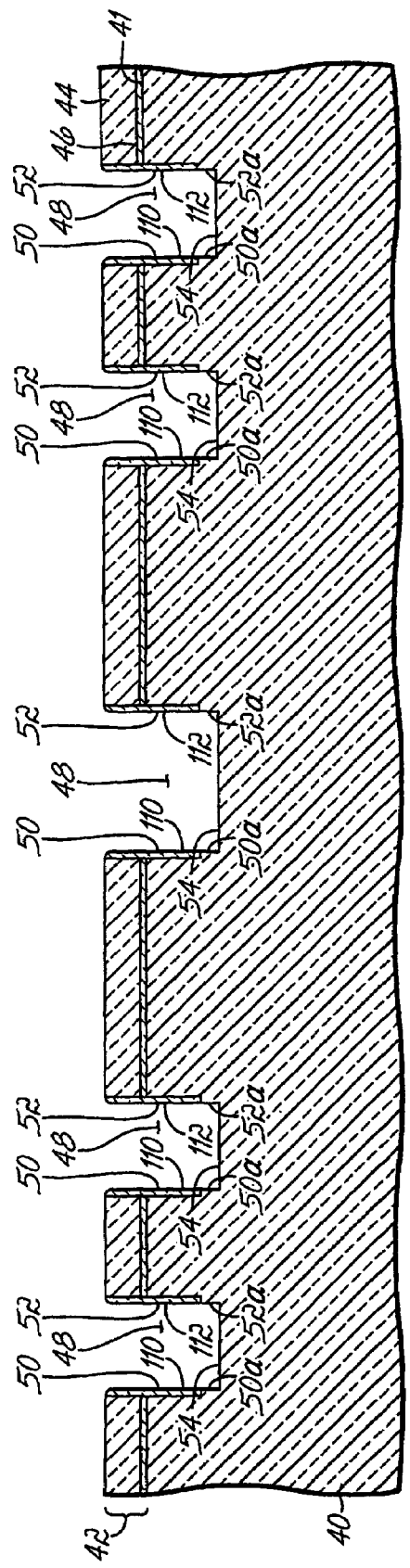
FIG. 7
FIG. 8

SEMICONDUCTOR STRUCTURES FOR LATCH-UP SUPPRESSION AND METHODS OF FORMING SUCH SEMICONDUCTOR STRUCTURES

FIELD OF THE INVENTION

The invention relates generally to semiconductor structures and methods and, in particular, to methods for reducing or suppressing latch-up in bulk complementary metal-oxide-semiconductor device structures and semiconductor structures fabricated by these methods.

BACKGROUND OF THE INVENTION

Complementary metal-oxide-semiconductor (CMOS) technologies integrate P- and N-channel field effect transistors (FETs) to form an integrated circuit on a single semiconductor substrate. Latch-up, which is precipitated by unwanted transistor action of parasitic bipolar transistors inherently present in bulk CMOS devices, may be a significant issue for bulk CMOS technologies. The unwanted parasitic transistor action, which has various triggers, may cause failure of bulk CMOS devices. For space-based applications, latch-up may be induced by the impingement of high energy ionizing radiation and particles (e.g., cosmic rays, neutrons, protons, alpha particles). Because the integrated circuit cannot be easily replaced in space flight systems, the chip failure may prove catastrophic. Hence, designing bulk CMOS devices with a high tolerance to latch-up is an important consideration for circuit operation in the natural space radiation environment, as well as military systems and high reliability commercial applications.

Bulk CMOS device designs may be adjusted to increase latch-up immunity. For example, latch-up immunity may be increased in 0.25 micron device technologies by building bulk CMOS devices on epitaxial substrates (e.g., a p-type epitaxial layer on a highly-doped p-type substrate wafer). Highly-doped substrate wafers provide excellent current sinks for currents that, if unabated, may initiate latch-up. However, epitaxial substrates are expensive to produce and may increase the design complexity of several critical circuits, such as electrostatic discharge (ESD) protective devices.

Guard ring diffusions represent another conventional approach for suppressing latch-up. However, guard ring diffusions are costly because they occupy a significant amount of active area silicon real estate. In addition, although guard ring diffusions collect a majority of the minority carriers in the substrate, a significant fraction may escape collection underneath the guard ring diffusion.

Semiconductor-on-insulator (SOI) substrates are recognized by the semiconductor community as generally free of latch-up. However, CMOS devices are expensive to fabricate on an SOI substrate, as compared to a bulk substrate. Furthermore, SOI substrates suffer from various other radiation-induced failure mechanisms aside from latch-up. Another disadvantage is that SOI devices do not generally come with a suite of ASIC books that would enable simple assembly of low-cost designs.

Conventional CMOS devices are susceptible to latch-up generally because of the close proximity of N-channel and P-channel devices. For example, a typical CMOS device fabricated on a p-type substrate includes a P-channel transistor fabricated in an N-well and an N-channel transistor fabricated in a P-well. The opposite conductivity N- and P-wells are separated by only a short distance and adjoin across a well junction. This densely-packed bulk CMOS structure inherently forms a parasitic lateral bipolar (PNP) structure and parasitic vertical bipolar (NPN) structure. Latch-up may occur due to regenerative feedback between these PNP and NPN structures.

With reference to FIG. 1, a portion of a standard triple-well bulk CMOS structure 30 (i.e., CMOS inverter) includes a P-channel transistor 10 formed in an N-well 12 of a substrate 11, an N-channel transistor 14 formed in a P-well 16 of the substrate 11 that overlies a buried N-band 18, and a shallow trench isolation (STI) region 20 separating the N-well 12 from the P-well 16. Other STI regions 21 are distributed across the substrate 11. The N-channel transistor 14 includes n-type diffusions representing a source 24 and a drain 25. The P-channel transistor 10 has p-type diffusions representing a source 27 and a drain 28. The N-well 12 is electrically coupled by a contact 19 with the standard power supply voltage ($V_{dd}$) and the P-well 16 is electrically coupled by a contact 17 to the substrate ground potential. The input of the CMOS structure 30 is connected to a gate 13 of the P-channel transistor 10 and to a gate 15 of the N-channel transistor 14. The output of CMOS structure 30 is connected to the drain 28 of the P-channel transistor 10 and the drain 25 of the N-channel transistor 14. The source 27 of the P-channel transistor 10 is connected to $V_{dd}$ and the source 24 of the N-channel transistor 14 is coupled to ground. Guard ring diffusions 34, 36 encircle the CMOS structure 30.

The n-type diffusions constituting the source 24 and drain 25 of the N-channel transistor 14, the isolated P-well 16, and the underlying N-band 18 constitute the emitter, base, and collector, respectively, of a vertical parasitic NPN structure 22. The p-type diffusions constituting the source 27 and drain 28 of the P-channel transistor 10, the N-well 12, and the isolated P-well 16 constitute the emitter, base, and collector, respectively, of a lateral parasitic PNP structure 26. Because the N-band 18 constituting the collector of the NPN structure 22 and the N-well 12 constituting the base of the PNP structure 26 are shared and the P-well 16 constitutes the base of the NPN structure 22 and also the collector of the PNP structure 26, the parasitic NPN and PNP structures 22, 26 are wired to result in a positive feedback configuration.

A disturbance, such as impinging ionizing radiation, a voltage overshoot on the source 27 of the P-channel transistor 10, or a voltage undershoot on the source 24 of the N-channel transistor 14, may result in the onset of regenerative action. This results in negative differential resistance behavior and, eventually, latch-up of the bulk CMOS structure 30. In latch-up, an extremely low-impedance path is formed between emitters of the vertical parasitic NPN structure 22 and the lateral parasitic PNP structure 26, as a result of the bipolar bases being flooded with carriers. The low-impedance state may precipitate catastrophic failure of that portion of the integrated circuit. The latched state may only be exited by removal of, or drastic lowering of, the power supply voltage below the holding voltage. Unfortunately, irreversible damage to the integrated circuit may occur almost instantaneously with the onset of the disturbance so that any reaction to exit the latched state is belated.

What is needed, therefore, is a semiconductor structure and fabrication method for modifying standard bulk CMOS device designs that suppresses latch-up, while being cost effective to integrate into the process flow, and that overcomes the disadvantages of conventional bulk CMOS semiconductor structures and methods of manufacturing such bulk CMOS semiconductor structures.

SUMMARY OF THE INVENTION

The present invention is generally directed to semiconductor structures and methods that improve latch-up immunity or suppression in standard bulk CMOS device designs, while retaining cost effectiveness for integration into the process flow forming the P-channel and N-channel field effect transistors characteristic of bulk CMOS devices. In accordance with an embodiment of the present invention, a semiconductor structure comprises a substrate of a semiconductor material and first and second doped wells formed in the semiconductor material of the substrate. The second doped well is disposed adjacent to the first doped well. A dielectric-filled trench is defined in the substrate between the first and second doped wells. The trench has a base, first sidewalls intersecting a top surface of the substrate, and second sidewalls disposed between the base and the first sidewalls. The second sidewalls have a wider separation than the first sidewalls.

In accordance with another embodiment of the present invention, a semiconductor structure comprises a substrate of a semiconductor material and first and second doped wells formed in the semiconductor material of the substrate. The second doped well is disposed adjacent to the first doped well along a well junction. A dielectric-filled trench is defined in the substrate between the first and second doped wells. The trench includes a base, first sidewalls intersecting a top surface of the substrate, and second sidewalls between the base and the first sidewalls. The second sidewalls have a narrower separation than the first sidewalls. The semiconductor material of the substrate bordering the second sidewalls includes a damage region comprising non-monocrystalline semiconductor material. The base of the trench is at a greater depth than the damage region for interrupting the continuity of the non-monocrystalline semiconductor material across the well junction.

In accordance with another embodiment of the present invention, a semiconductor structure comprises a substrate of a first material characterized by semiconducting properties, first and second doped wells formed in the substrate, a trench defined in the substrate between the first and second doped wells, and a dielectric material filler in the trench. The second doped well is disposed adjacent to the first doped well. The trench includes a base and sidewalls intersecting a top surface of the substrate. A layer of a second material is disposed between the first material at the base of the trench and the dielectric material filler. The first and second materials have a crystal lattice constant difference sufficient to increase carrier recombination velocity.

In another embodiment of the present invention, a method is provided for fabricating a semiconductor structure in a substrate of semiconductor material. The method comprises forming a trench in the semiconductor material with a first sidewall and a second sidewall each disposed between a base of the trench and a top surface of the substrate. The method further comprises forming an oxygen-enriched region in the semiconductor material of the substrate bounding the first sidewall of the trench near the base and converting the oxygen-enriched region to an oxide region.

In yet another embodiment of the present invention, a method is provided for fabricating a semiconductor structure in a substrate of semiconductor material. The method comprises forming a trench in the semiconductor material with first sidewalls extending from a base toward a top surface of the substrate and forming a damage region comprising non-monocrystalline semiconductor material at a first depth in the substrate below the base of the first trench. The method further comprises forming a second trench registered with the first trench and having second sidewalls between the base of the first trench to a second depth greater than the first depth. The second trench partitions the damage region such that the non-monocrystalline semiconductor material is discontinuous.

In yet another embodiment of the present invention, a method is provided for fabricating a semiconductor structure in a substrate of semiconductor material. The method comprises forming a trench in the semiconductor material with sidewalls extending from a base toward a top surface of the substrate and forming an etch mask on the sidewalls. The method further comprises etching the trench to increase a depth of the base from the top surface using an isotropic etchant that removes the semiconductor material of the substrate bordering the trench below the etch mask to widen the sidewalls of the trench below the etch mask.

In another embodiment of the present invention, a method is provided for fabricating a semiconductor structure in a substrate of a first material characterized by semiconducting properties. The method comprises forming a trench in the first material with sidewalls between a base and a top surface of the substrate and forming a layer of a second material on the base of the trench that has a crystal lattice constant difference in comparison with the first material sufficient to increase carrier recombination velocity in the first material adjacent to the base.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 2-5 are diagrammatic views of a portion of a substrate at various fabrication stages of a processing method in accordance with an embodiment of the present invention

FIGS. 7-12 are diagrammatic views of a portion of a substrate at various fabrication stages of a processing method in accordance with an alternative embodiment of the present invention.

DETAILED DESCRIPTION

Figure 1:
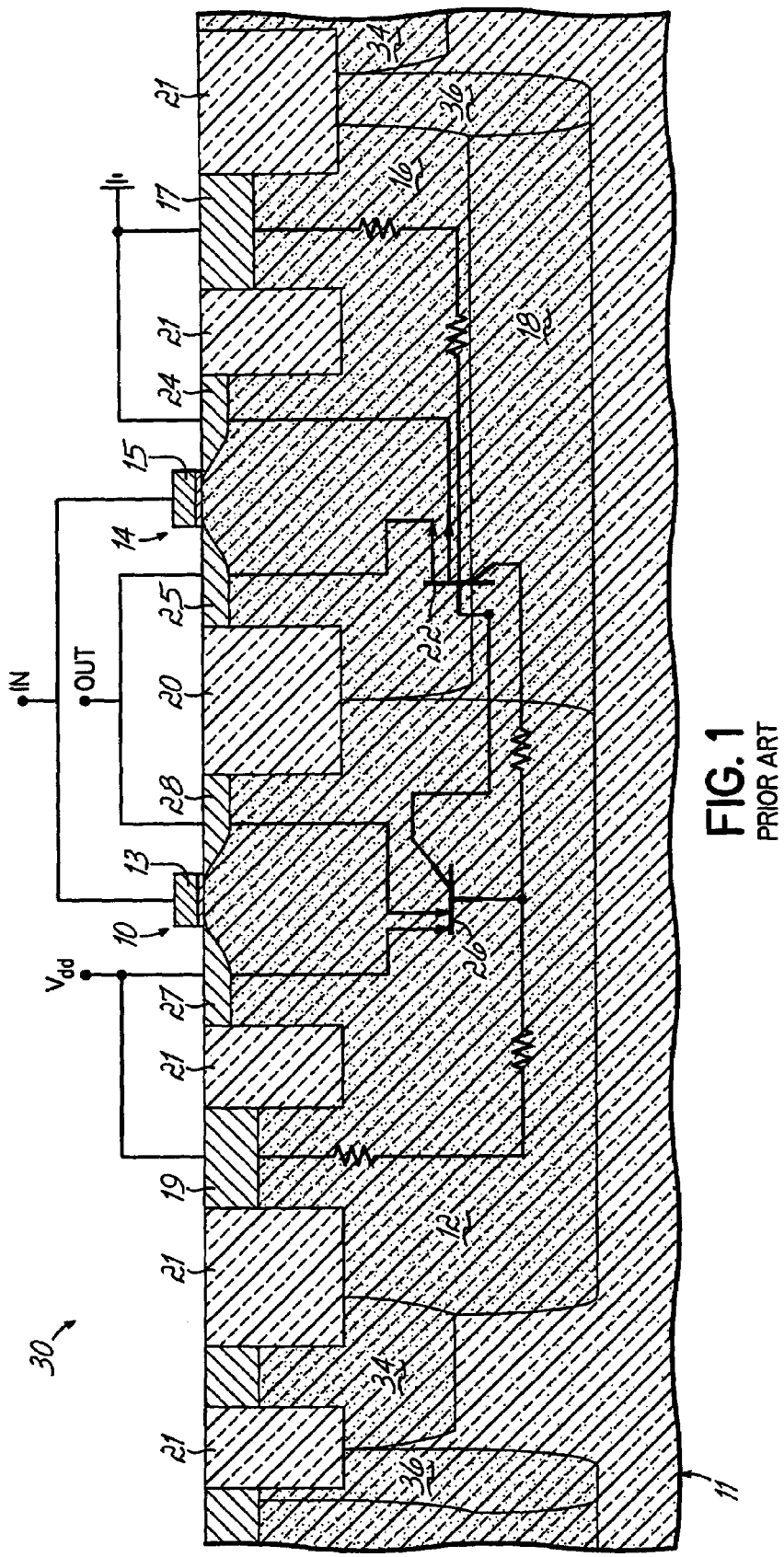
FIG. 1 is a diagrammatic view of a portion of a substrate with a bulk CMOS device constructed in accordance with the prior art.

The present invention provides an isolation region that limits the effect of the vertical parasitic NPN structure and the lateral parasitic PNP structure responsible for latch-up in triple-well bulk CMOS devices. The invention is advantageously implemented in the context of bulk CMOS devices where pairs of N-channel and P-channel field effect transistors are formed adjacent to each other in a P-well within an N-band and an N-well, respectively, and the P-well is isolated from the N-well by a shallow trench isolation (STI) region. Specifically, the latchup immunity of a standard bulk CMOS triple well structure is improved by modifying the geometry of the STI region or by selectively adding damage regions to the STI region in a manner that significantly reduces the susceptibility to latch-up. The present invention will now be described in greater detail by referring to the drawings that accompany the present application.

With reference to FIG. 2, a bulk substrate 40 of a monocrystalline semiconductor material is obtained. Substrate 40 may include a low-defect epitaxial layer for device fabrication that is grown by an epitaxial growth process, such as chemical vapor deposition (CVD) using a silicon source gas (e.g., silane). Substrate 40 may be a single crystal silicon wafer containing a relatively light concentration of a dopant providing p-type conductivity. For example, substrate 40 may be lightly doped with $5 \times 10^{15}$ cm$^{-3}$ to $1 \times 10^{17}$ cm$^{-3}$ of a p-type dopant, such as boron, by in situ doping during deposition of the epitaxial layer.

A pad structure 42 is formed on a top surface 41 of the substrate 40. The pad structure 42 includes a first pad layer 44 and a thinner second pad layer 46 separating the first pad layer 44 from the substrate 40. The constituent material(s) of pad layers 44, 46 advantageously etch selectively to the semiconductor material constituting substrate 40. The first pad layer 44 may be a conformal layer of nitride ($Si_3N_4$) formed by a thermal CVD process like low pressure chemical vapor deposition (LPCVD) or a plasma-assisted CVD process. The second pad layer 46 may be silicon oxide ($SiO_2$) grown by exposing substrate 40 to either a dry oxygen ambient or steam in a heated environment or deposited by a thermal CVD process. The second pad layer 46 may operate as a buffer layer to prevent any stresses in the material constituting the first pad layer 44 from causing dislocations in the semiconductor material of substrate 40.

Shallow trenches 48 are formed in the semiconductor material of substrate 40 by a conventional lithography and subtractive etching process that utilizes a shallow trench pattern imparted in the pad structure 42 (FIG. 2) or, optionally, in a patterned hard mask (not shown) formed on pad structure 42. The shallow trench pattern may be created in pad structure 42 by applying a photoresist (not shown) on pad layer 44, exposing the photoresist to a pattern of radiation to create a latent shallow trench pattern in the photoresist, and developing the latent shallow trench pattern in the exposed photoresist. An anisotropic dry etching process, such as reactive-ion etching (RIE) or plasma etching, may then be used to transfer the trench pattern from the patterned resist into the pad layers 44, 46. The etching process, which may be conducted in a single etching step or multiple etching steps with different etch chemistries, removes portions of the pad structure 42 visible through the trench pattern in the patterned resist and stops vertically on the substrate 40. After etching is concluded, residual resist is stripped from the pad structure 42 by, for example, plasma ashing or a chemical stripper.

The shallow trench pattern is then transferred from the patterned pad layer 44 into the underlying substrate 40 with an anisotropic dry etching process. The anisotropic dry etching process may be constituted by, for example, RIE, ion beam etching, or plasma etching using an etch chemistry (e.g., a standard silicon RIE process) that removes the constituent semiconductor material of substrate 40 selective to the materials constituting the pad layers 44, 46. Each of the shallow trenches 48 defined in the semiconductor material of substrate 40 includes opposite sidewalls 50, 52, which are substantially mutually parallel and oriented substantially perpendicular to the top surface 41 of substrate 40, that extend into the substrate 40 to a bottom surface or base 54.

Energetic ions, as indicated diagrammatically by singled-headed arrows 56, are introduced by an ion implantation process into the substrate 40 to create an oxygen-enriched or oxygen implanted region 58 proximate to and just beneath the base 54 of each shallow trench 48. The energetic ions 56, which are generated from a source gas, are directed to impinge the top surface 41 of the substrate 40 at normal or near-normal incidence, although the invention is not so limited. The ions 56 may be implanted with the substrate 40 at or near room or ambient temperature, although the present invention is not so limited.

The ions 56 lose energy via scattering events with atoms and electrons in the semiconductor material constituting substrate 40 as the ions 56 penetrate the substrate 40. The ions 56 eventually dissipate all of their initial kinetic energy and stop in the substrate 40 to produce the oxygen implanted regions 58. The stopped ions 56 in the oxygen implanted regions 58 are characterized by a depth profile distributed about a projected range, which is measured as a perpendicular distance of the damage peak from the top surface 41. The depth profile is characterized by a range straggle, which represents a deviation or second moment of the stopped ions 56 about the projected range. Essentially all of the implanted ions 56 come to rest in the semiconductor material of substrate 40 within a distance of three times the range straggle from the projected range. The implanted ions 56 also have a lateral straggle that causes side edges 60, 62 of the oxygen implanted regions 58 to extend beyond the sidewalls 50, 52 of each shallow trench 48.

The ions 56 may originate from a source selected to provide, when ionized and accelerated to impart kinetic energy, oxygen ions. The implanted species may be either charged atomic oxygen ions ($O^+$) or molecular ions ($O^{+2}$). Advantageously, the peak atomic concentration for the implanted ions 56 in the oxygen implanted regions 58 may be in the range of $5 \times 10^{19}$ cm$^{-3}$ to $5 \times 10^{21}$ cm$^{-3}$ and, in certain embodiments, may be as low as $5 \times 10^{18}$ cm$^{-3}$ to provide the requisite oxygen concentration. For example, a suitable dose of implanted $O^+$ may range from $1 \times 10^{14}$ cm$^{-2}$ to $5 \times 10^{16}$ cm$^{-2}$ at a kinetic energy between about 10 keV and about 50 keV, although the invention is not so limited. The present invention contemplates other implant conditions, i.e., energy and dose, may be used that are capable of forming oxygen implanted regions 58 in substrate 40. The ions 56 are implanted across the top surface 41 of the entire substrate 40, although certain regions of substrate 40 may be optionally protected by a block mask during implantation. Ions of an oxidation rate enhancing atomic species, such as germanium (Ge), silicon (Si), or arsenic (As) for n-well applications, or boron difluoride ($BF_2$) for p-well applications, may be co-implanted with ions 56. A block mask (not shown) of, for example, photoresist may protect a portion of the substrate 40 during the ion implantation process.

With reference to FIG. 3 in which like reference numerals refer to like features in FIG. 2 and at a subsequent fabrication stage, spacers 64, 66 are formed on the sidewalls 50, 52 of each shallow trench 48. Spacers 64, 66 may be defined from a conformal layer (not shown) of a dielectric material, such as 5 nm to 15 nm of nitride deposited by a CVD process, that is anisotropically etched using a reactive ion etch (RIE) or plasma etching process. The etching process removes the material of the conformal layer (not shown) primarily from horizontal surfaces selective to (i.e., with a significantly greater etch rate than) the constituent semiconductor material of substrate 40. The base 54 of each shallow trench 48 is exposed after the spacers 64, 66 are formed.

With reference to FIG. 4 in which like reference numerals refer to like features in FIG. 3 and at a subsequent fabrication stage, a majority of each of the oxygen implanted regions 58 (FIG. 3) is converted by a thermal oxidation process to one of a plurality of oxide regions 68 each consisting of an oxide (e.g., silicon dioxide). The thermal oxidation process may be performed in a dry or wet oxidizing ambient atmosphere and at a temperature ranging from about 750° C. to about 1100° C. The oxidizing species from the oxidizing ambient atmosphere penetrates the substrate 40 through the exposed base 54 of each shallow trench 48 in order to reach the oxygen implanted regions 58. Spacers 64, 66 protect the sidewalls 50, 52 of each shallow trench 48 against unwanted oxidation. The implanted oxygen in the oxygen implanted regions 58 (FIG. 3) enhances the oxidation rate for the corresponding semiconductor material of substrate 40 when exposed to the oxidizing species from the oxidizing ambient atmosphere.

The perimeter of each oxide region 68 defines a curved boundary 69 that extends laterally or horizontally of the sidewalls 50, 52 of each shallow trench 48 because of the lateral oxide growth during the thermal oxidation process. The lateral extent of the concave boundary 69 of each oxide region 68 roughly coincides with the side edges 60, 62 of the oxygen implanted regions 58 or may be slightly narrower than the side edges 60, 62. Each oxide region 68 defines a degree of undercut relative to the sidewalls 50, 52 and the degree of undercut increases with increasing energy of the implanted ions 56. The lateral oxide growth defines lateral extensions 73, 75 of STI regions 74 (FIG. 5), effectively defining sidewalls 70, 72 that widen each shallow trench 48 relative to sidewalls 50, 52, and increases the depth of base 54 relative to the top surface 41. The base 54 of each shallow trench 48 is effectively deepened to a greater depth by the oxidation process forming oxide regions 68 as the remaining open volume in each shallow trench 48 is filled with dielectric material in a subsequent fabrication stage.

A portion of each oxygen implanted region 58 (FIG. 3) may remain, after the thermal oxidation process, as a damage region 71 proximate to the curved boundary 69 of the corresponding oxide region 68. The stopping of the ions 56 (FIG. 2) implanted in substrate 40 damages the constituent semiconductor material to form non-monocrystalline semiconductor material confined within damage region 71. Energy transferred by nuclear collisions between ions 56 and target atoms in the substrate 40 displaces those target atoms from their original lattice sites and, as a consequence, permanently damages the semiconductor material of the substrate 40. When each individual ion 56 displaces a target atom of the substrate 40 in a nuclear collision, a recoil cascade is initiated that dissipates the transferred kinetic energy by collisions with other target atoms. The recoil cascade generates additional vacancies and interstitial atoms in the lattice structure of substrate 40 dispersed among the atoms in the crystalline lattice structure remaining on regular lattice sites. The damage in the damage region 71 may comprise extended crystal lattice defects that are larger than point defects and disrupt long range order, or may render the crystalline structure amorphous. The crystalline damage in the damage region 71 coincides approximately with the depth profile of the stopped ions 56 and is stable in that the damage region 71 remains after subsequent fabrication steps.

Figure 5A:
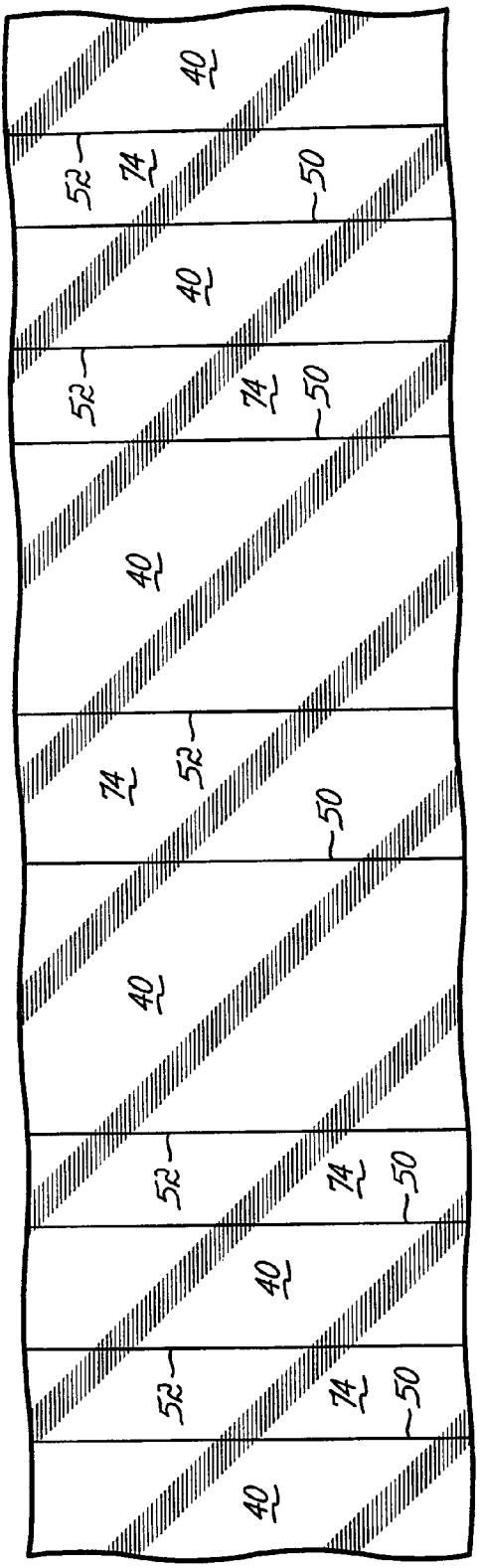
FIG. 5A is a top view of the substrate portion at the fabrication stage of FIG. 5.

With reference to FIGS. 5 and 5A in which like reference numerals refer to like features in FIG. 4 and at a subsequent fabrication stage, the shallow trenches 48 are filled with amounts of an insulating or dielectric material, such as a high-density plasma (HDP) oxide or tetraethylorthosilicate (TEOS), deposited across the pad layer 44 and planarized by, for example, a CMP process. An optional high temperature process step may be used to densify the TEOS fill. The pad structure 42 is removed by a planarization process to define shallow trench isolation (STI) regions 74 in the substrate 40 having a top surface substantially co-planar or flush with the top surface 41 of substrate 40.

Figure 6:
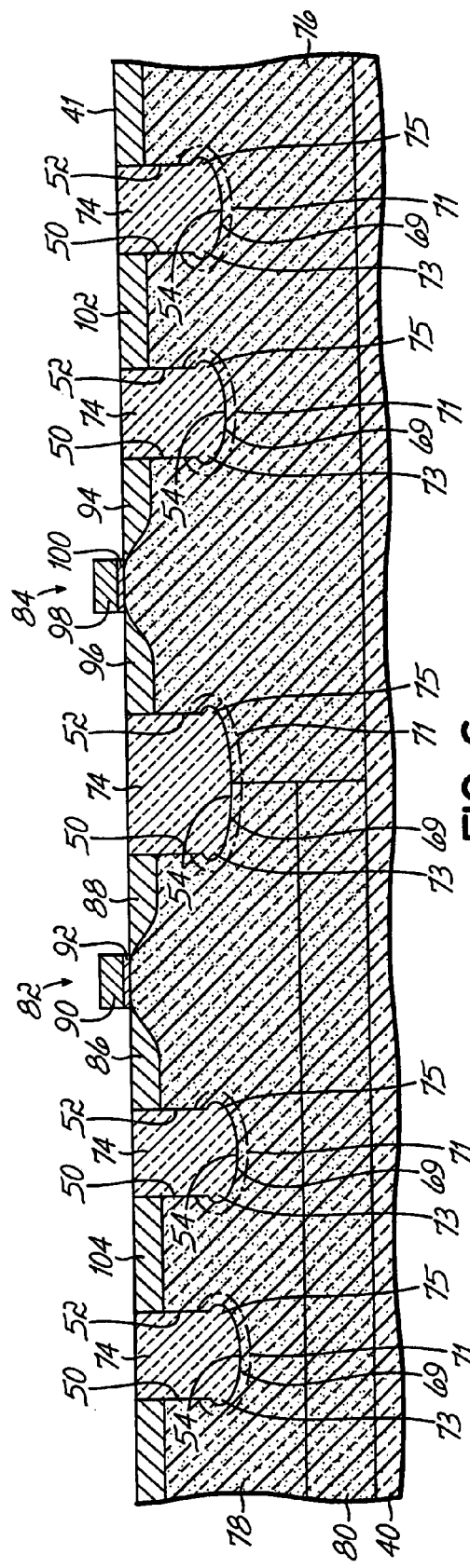
FIG. 6 is a diagrammatic view of the portion of the substrate at a fabrication stage subsequent to the fabrication stage of FIG. 5.

With reference to FIG. 6 in which like reference numerals refer to like features in FIG. 5 and at a subsequent fabrication stage, standard bulk CMOS processing follows, which includes formation of a triple-well structure consisting of an N-well 76, a P-well 78, and a deep buried N-well or N-band 80 in the substrate 40. The buried N-band 80 supplies electrical isolation for the P-well 78. This triple-well construction permits the optimization of bias potentials for both N- and P-wells 76, 78. The P-well 78 is arranged between the N-band 80 and the top surface 41.

The N-well 76, as well as other N-wells (not shown) dispersed across the substrate 40, are likewise formed by patterning a mask layer (not shown) applied on the top surface 41 with techniques known in the art, and implanting an appropriate n-conductivity type impurity into the substrate 40 in unmasked regions. The N-band 80, as well as other N-bands (not shown) dispersed across the substrate 40, are formed by patterning another mask layer (not shown), such as a photoresist, applied on top surface 41 and implanting an appropriate n-conductivity type impurity into the substrate 40 in this set of unmasked regions. The P-well 78, as well as other P-wells (not shown) dispersed across the substrate 40, are likewise formed by patterning another mask layer (not shown) applied on top surface 41 and implanting an appropriate p-conductivity type impurity into the substrate 40 in this set of unmasked regions. Typically, the P-well 78 is formed by counterdoping the N-band 80 and has an opposite conductivity type from the N-well 76 and N-band 80. Generally, the dopant concentration in the N-well 76 ranges from about $5.0 \times 10^{17}$ cm$^{-3}$ to about $7.0 \times 10^{18}$ cm$^{-3}$, the dopant concentration in the P-well 78 ranges from about $5.0 \times 10^{17}$ cm$^{-3}$ to about $7.0 \times 10^{18}$ cm$^{-3}$, and the dopant concentration in the N-band 80 ranges from about $5.0 \times 10^{17}$ cm$^{-3}$ to about $7.0 \times 10^{18}$ cm$^{-3}$. A thermal anneal may be required to electrically activate the implanted impurities operating as the p-type and n-type dopants.

An N-channel transistor 82 is built using the P-well 78, and a P-channel transistor 84 is built using the N-well 78 to define a bulk CMOS device. The N-channel transistor 82 includes n-type diffusions in the semiconductor material of substrate 40 representing a source region 86 and a drain region 88 that flank opposite sides of a channel region in the semiconductor material of substrate 40, a gate electrode 90 overlying the channel region, and a gate dielectric 92 electrically isolating the gate electrode 90 from the substrate 40. The P-channel transistor 84 includes p-type diffusions in the semiconductor material of substrate 40 representing a source region 94 and a drain region 96 that flank opposite sides of a channel region in the semiconductor material of substrate 40, a gate electrode 98 overlying the channel region, and a gate dielectric 100 electrically isolating the gate electrode 98 from the substrate 40. Other structures, such as sidewall spacers (not shown), may be included in the construction of the N-channel transistor 82 and the P-channel transistor 84.

The conductor used to form the gate electrodes 90, 98 may be, for example, polysilicon, silicide, metal, or any other appropriate material deposited by a CVD process, etc. The source and drain regions 86, 88 and the source and drain regions 94, 96 may be formed in the semiconductor material of substrate 40 by ion implantation of suitable dopant species having an appropriate conductivity type. The gate dielectrics 92, 100 may comprise any suitable dielectric or insulating material like silicon dioxide, silicon oxynitride, a high-k dielectric, or combinations of these dielectrics. The dielectric material constituting dielectrics 92, 100 may be between about 1 nm and about 10 nm thick, and may be formed by thermal reaction of the semiconductor material of the substrate 40 with a reactant, a CVD process, a physical vapor deposition (PVD) technique, or a combination thereof.

Processing continues to complete the semiconductor structure, including forming electrical contacts to the gate electrodes 90, 98, source region 86, drain region 88, source region 94, and drain region 96. The contacts may be formed using any suitable technique, such as a damascene process in which an insulator is deposited and patterned to open vias, and then the vias are filled with a suitable conductive material, as understood by a person having ordinary skill in the art. The N-channel and P-channel transistors 82, 84 are coupled using the contacts with other devices on substrate 40 and peripheral devices with a multilevel interconnect structure consisting of conductive wiring and interlevel dielectrics (not shown). A contact 102 is also formed in substrate 40 that is electrically coupled with the N-well 76 for supplying the standard power supply voltage ($V_{dd}$) to the N-well 76. Another contact 104 is formed in substrate 40 for coupling the P-well 78 with the substrate ground potential.

In accordance with the principles of the invention, the lateral extensions 73, 75 of the bottom portion of the STI regions 74 increase the base width or P-well path for the parasitic NPN structure 22 (FIG. 1) and the base width or N-well path for the PNP structure 26 (FIG. 1). As a consequence, holes traversing the N-well 76 to the P-well 78, which constitutes the collector of the PNP structure 26, and electrons traversing the P-well 78 to the N-well 76, which constitutes the collector of the NPN structure 22, must flow around the lateral extensions 73, 75, which defines an inverted-T structure. A bump in the electric potential forms at the lateral extensions 73, 75, due to the concavity of the silicon surface about curved boundary 69 and bounding the side edges 70, 72 of the lateral extensions 73, 75. This potential bump impedes the flow of minority carriers and results in reduced beta for both parasitic NPN and PNP structures 22, 26. The damage regions 71 in the semiconductor material of the substrate 40, if present, are believed to reduce the minority carrier lifetimes and to contribute to the reduction of the bipolar gain of the parasitic NPN and PNP structures 22, 26.

With reference to FIG. 7 in which like reference numerals refer to like features in FIG. 2 and in accordance with an alternative embodiment of the present invention that does not rely on an ion implantation process, the anisotropic dry etching process transferring the trenches 48 from the patterned pad layer 44 into the underlying substrate 40 is halted at an intermediate base 106 that is shallower than base 54 (FIG. 2). A conformal layer 108 of a dielectric material, such as 5 nm to 15 nm of silicon nitride deposited by a CVD process, is formed on the pad layer 44 and the sidewalls 50, 52 and intermediate base 106 of trenches 48.

With reference to FIG. 8 in which like reference numerals refer to like features in FIG. 7 and at a subsequent fabrication stage, the conformal layer 108 is anisotropically etched using, for example, an RIE or plasma etching process that removes the material constituting the conformal layer primarily from horizontal surfaces selective to (i.e., with a significantly greater etch rate than) the constituent semiconductor material of substrate 40. Un-removed portions of the conformal layer 108 define spacers 110, 112 on the sidewalls 50, 52 of each shallow trench 48.

Using the pad structure 42 and spacers 110, 112 as a mask, an anisotropic etching process is used to deepen the shallow trenches 48, which defines base 54. Respective surfaces 50a, 52a of the semiconductor material of substrate 40 are exposed between base 54 and the spacers 110, 112, as is the surface along base 54. The depth difference between base 54 and intermediate base 106, which is determined based upon depths measured as a perpendicular distance relative to surface 41, may be, for example, about 0.1 µm. The depth difference also defines the vertical height of the surfaces 50a, 52a across which the semiconductor material of substrate 40 borders the shallow trench 48 and, hence, is unmasked by spacers 110, 112. The absolute depths to which the shallow trenches 48 are etched may vary according to device design.

Figure 9:
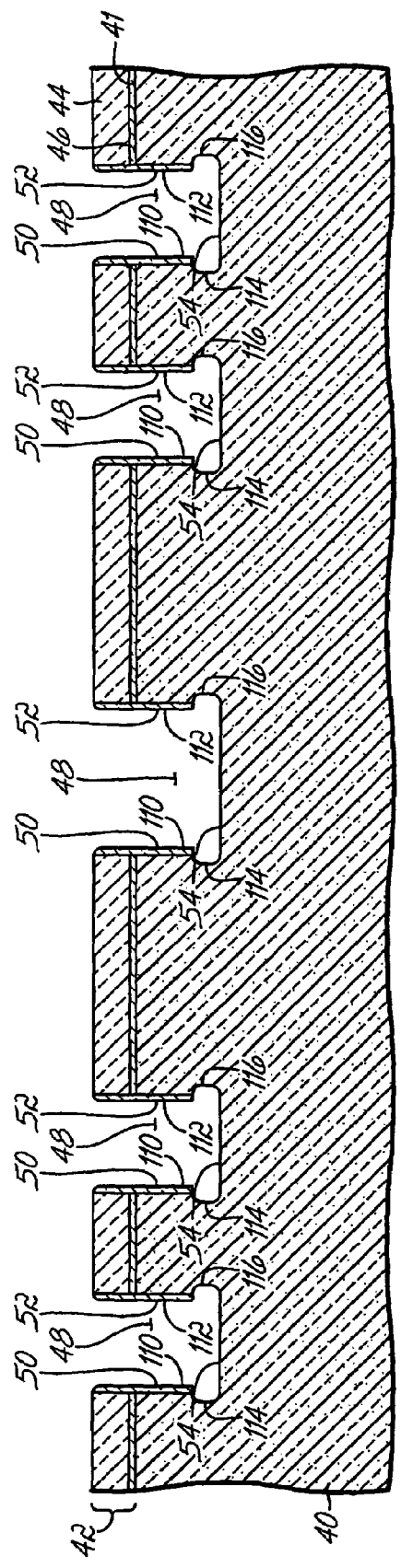

With reference to FIG. 9 in which like reference numerals refer to like features in FIG. 8 and at a subsequent fabrication stage, an isotropic etching process is used to etch the semiconductor material of substrate 40 bordering shallow trenches 48 exposed across the surfaces 50a, 52a and base 54. The isotropic etching process, which may be conducted in a single etching step or multiple steps with different etch chemistries, selectively removes the semiconductor material of substrate 40 vertically to slightly deepen base 54. The isotropic etching process also removes the semiconductor material of substrate 40 laterally across the surfaces 50a, 52a to define sidewalls 114, 116 that have a wider separation than sidewalls 50, 52. During the isotropic etching process, the spacers 110, 112 mask and protect sidewalls 50, 52 above surfaces 50a, 52a against removal. For example, the etching process may rely on an isotropic silicon etchant such as a wet or dry hydrofluoric acid etchant.

Figure 10:
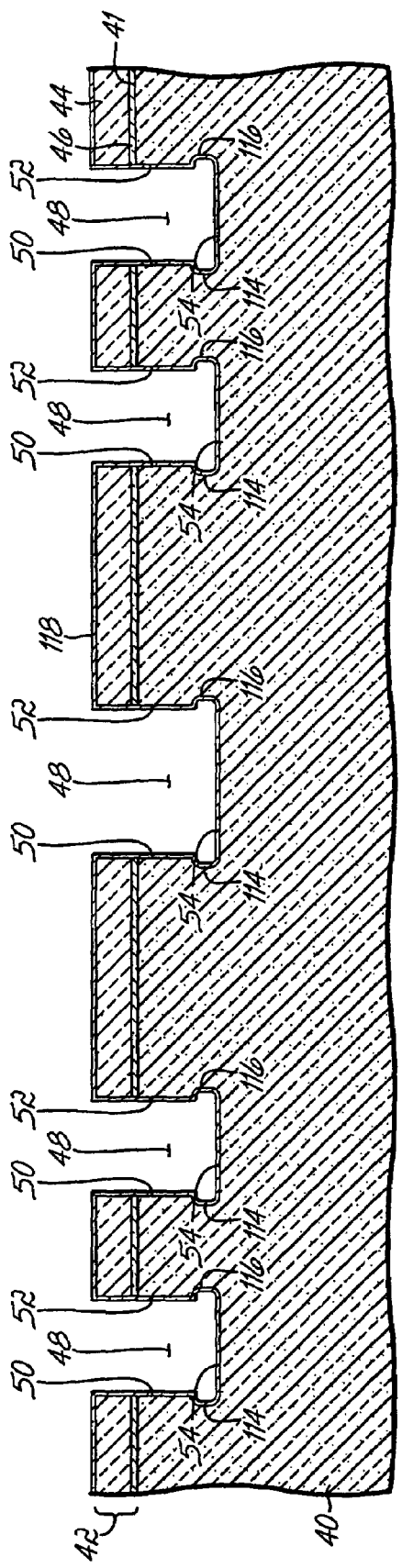

With reference to FIG. 10 in which like reference numerals refer to like features in FIG. 9 and at a subsequent fabrication stage, spacers 110, 112 are stripped from the sidewalls 50, 52 of each shallow trench 48 using an appropriate etching process. A liner 118 is formed on the sidewalls 50, 52, sidewalls 114, 116, and base 54, as well as on the pad layer 44. The liner 118 may be, for example, silicon oxide grown by exposing the unmasked semiconductor material of substrate 40 to either a dry oxygen ambient or steam in a heated environment. Another optional liner (not shown) of, for example, silicon nitride may be applied as a diffusion barrier to prevent impurity migration from the trench fill material into the semiconductor material of substrate 40 bordering the shallow trenches 48. The liner 118 also operates to repair any etch damage incurred by the sidewalls 50, 52, sidewalls 114, 116, and base 54 of each shallow trench 48.

Figure 11:
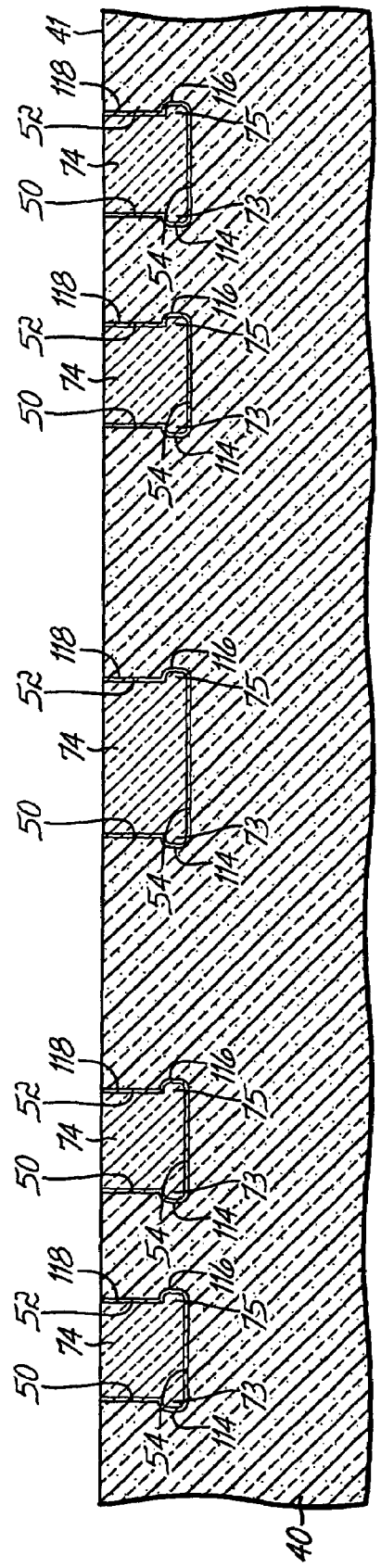

With reference to FIG. 11 in which like reference numerals refer to like features in FIG. 10 and at a subsequent fabrication stage, the shallow trenches 48 are filled with an insulating or dielectric material, such as HDP oxide or TEOS, deposited across the pad layer 44 and planarized by, for example, a CMP process. The pad structure 42 and excess liner 118 on the pad layer 44 are removed and planarized to define the STI regions 74 in the substrate 40 by a planarization process that makes the top surface of the STI regions 74 substantially co-planar or flush with the top surface 41 of substrate 40. Portions of the dielectric material fill the concavities bounded by sidewalls 114, 116 to form the lateral extensions 73, 75 at the bottom of the STI regions 74.

Figure 12:
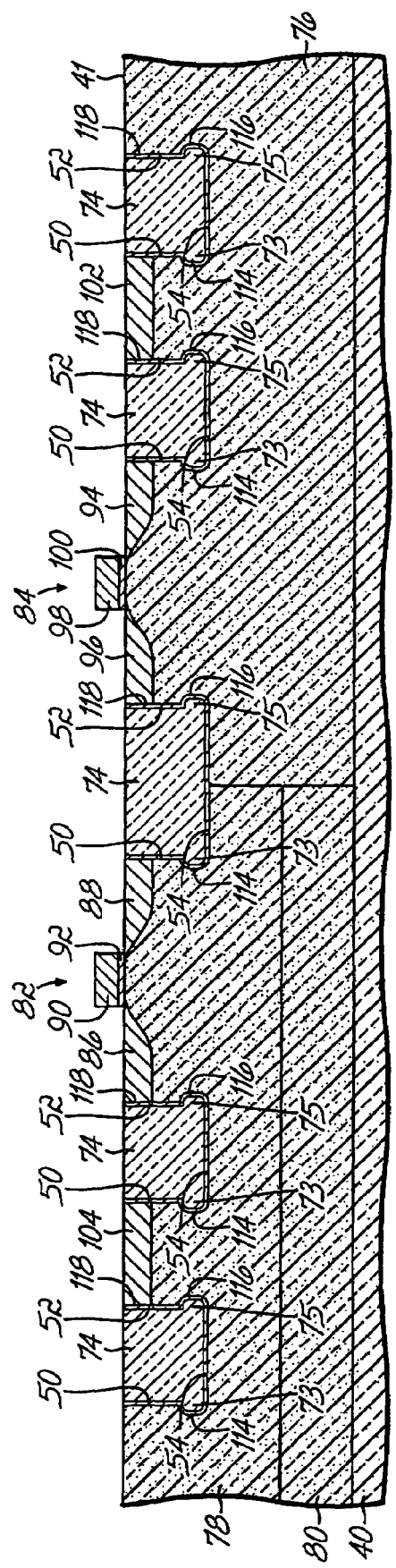

With reference to FIG. 12 in which like reference numerals refer to like features in FIG. 11 and at a subsequent fabrication stage, standard bulk CMOS processing follows as described above with regard to FIG. 6 to form the N- and P-wells 76, 78, the N-band 80, the N-channel transistor 82, the P-channel transistor 84, and contacts 102, 104 in the substrate 40. A person having ordinary skill in the art will appreciate that this embodiment of the present invention may be advantageously implemented in a dual-well CMOS structure that lacks the N-band 80.

Figure 13:
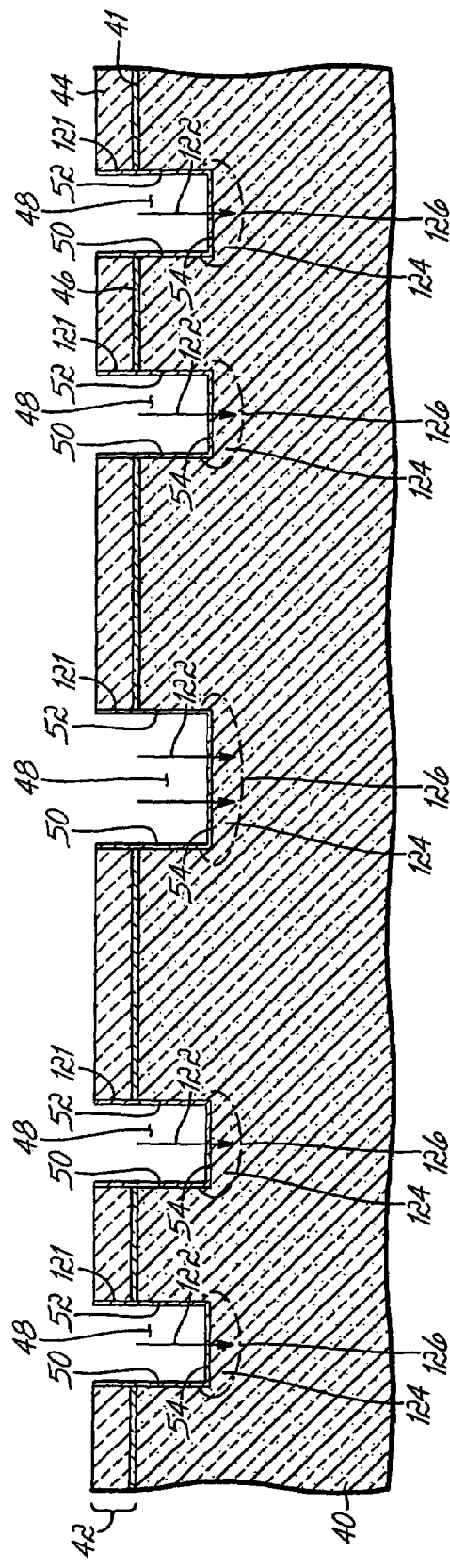
FIGS. 13-15 are diagrammatic views of a portion of a substrate at various fabrication stages of a processing method in accordance with an alternative embodiment of the present invention.

With reference to FIG. 13 in which like reference numerals refer to like features in FIG. 2 and in accordance with an alternative embodiment of the present invention that minimizes damage across a well junction 142 (FIG. 15) between the subsequently-formed N- and P-wells 138, 140 (FIG. 15) in a dual-well structure, a crystal damaging species is ion implanted into the base 54 of the shallow trenches 48 before the STI regions 74 (FIG. 15) are defined by filling the shallow trenches 48 with dielectric material. Before implantation, the shallow trenches 48 are lined with a liner 121 consisting of one or more individual layers (not shown) of suitable materials, such as 1 nm to 3 nm of thermally grown silicon oxide covered by 4 nm to 20 nm of silicon nitride deposited conformally by a CVD process.

Local crystalline damage regions 124, which include semiconductor material of substrate 40 that has been converted to a non-monocrystalline state and includes point and extended defects, are formed by introducing energetic ions, as indicated diagrammatically by singled-headed arrows 122, by an ion implantation process into the substrate 40. The energetic ions 122, which are generated from a source gas, are directed to impinge the substrate 40 at normal or near-normal incidence. The ions 122 may originate from a source gas selected to provide, when ionized and accelerated to impart kinetic energy, neutral impurities in silicon like nitrogen (N), oxygen (O), carbon (C), gold (Au), platinum (Pt), germanium (Ge), and silicon (Si), and other suitable elements capable of inducing lattice damage. The ions 122 may be implanted with the substrate 40 at or near room or ambient temperature, although the present invention is not so limited. The pad structure 42 masks underlying regions of the substrate 40 against receiving an ion dose during the ion implantation process such that only damage regions 124 of the substrate 40 are implanted with a significant dose of ions 122.

The trajectories of the ions 122 penetrate the substrate 40 across base 54 of at least the shallow trench 48 that, after subsequent fabrication stages, intersects the well interface 142 (FIG. 15), as well as optionally other trenches 48. The ions 122 lose energy via scattering events with atoms and electrons in the semiconductor material constituting substrate 40. Kinetic energy lost in nuclear collisions displaces target atoms of the substrate 40 from their original lattice sites and permanently damages the substrate 40. When each individual ion 122 collides with a target atom of the substrate 40, a recoil cascade is initiated that dissipates the transferred kinetic energy by collisions with other target atoms. The recoil cascade generates vacancies and interstitial atoms in the lattice structure of substrate 40 among the atoms in the lattice structure remaining on regular lattice sites.

The ions 122 eventually lose all of their initial kinetic energy and stop in the substrate 40 to produce one of the damage regions 124 of non-monocrystalline semiconductor material near the base 54 of each shallow trench 48. The crystalline damage in the damage regions 124 coincides approximately with the depth profile of the stopped ions 122. Similar to the stopped ions 122, each damage region 124 is characterized by a depth profile distributed about a projected range, which is measured as a perpendicular distance of the damage peak from the top surface 41, and having a range straggle. Essentially all of the implanted ions 122 come to rest within a distance of three times the range straggle from the projected range, which implies that the damage has a similar distribution. After the ion implantation is concluded, uncombined vacancies and interstitial atoms remain and are distributed across the thickness of the damage regions 124, as well as extended defects. The depth profile of the implanted ions 122 and damage also has a characteristic lateral straggle such that ions 122 and damage extend laterally of the sidewalls 50, 52, as indicated generally by boundary 126.

The ion dose is preferably selected such that the peak atomic concentration of the implanted ions 122 in each damage region 124 exceeds the solid solubility of the impurity in the constituent material of the substrate 40. By exceeding the solid solubility, subsequent heated process steps do not anneal the crystalline defects in the damage regions 124. Advantageously, the peak atomic concentration for the implanted ions 122 in each damage region 124 may be in the range of $5 \times 10^{19}$ cm$^{-3}$ to $5 \times 10^{21}$ cm$^{-3}$ and, in certain embodiments, may be as low as $5 \times 10^{18}$ cm$^{-3}$ to provide the requisite crystalline damage. For example, a suitable implanted ion dose may range from $1 \times 10^{14}$ cm$^{-2}$ to $5 \times 10^{16}$ cm$^{-2}$ at a kinetic energy between about 10 keV and about 50 keV, although the invention is not so limited. The present invention contemplates other implant conditions, i.e., energy and dose, that are capable of forming the damage regions 124 in substrate 40. The ions 122 are implanted across the top surface 41 of the entire substrate 40, although certain regions of substrate 40 may be optionally protected by a block mask (not shown) during implantation.

Figure 14:
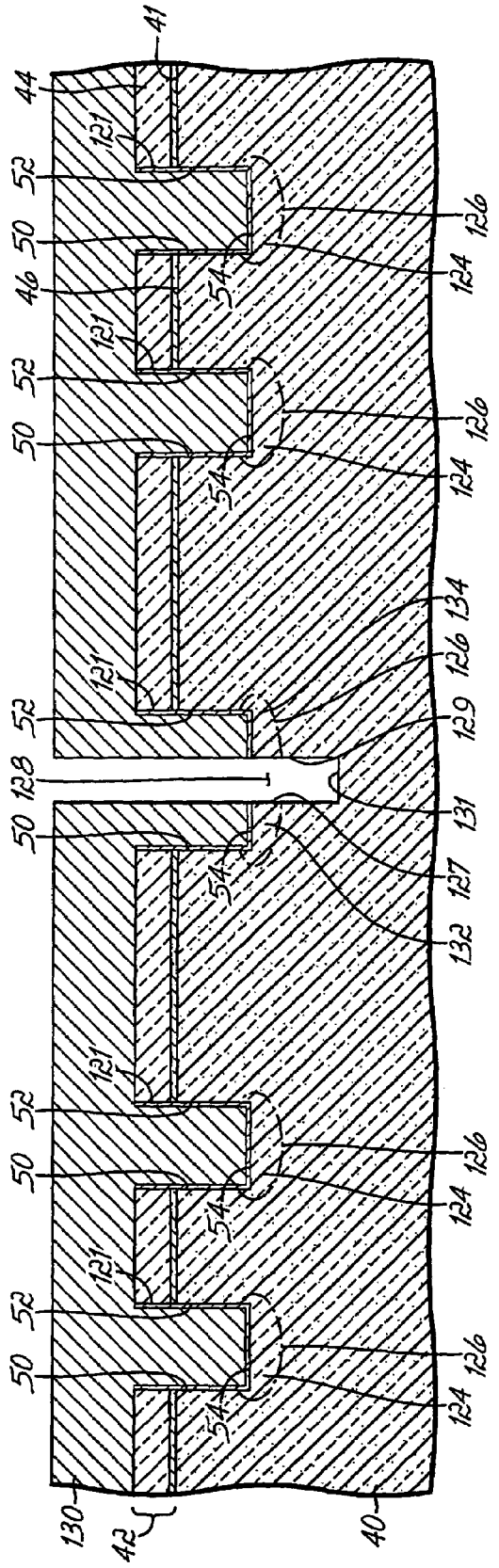

With reference to FIG. 14 in which like reference numerals refer to like features in FIG. 13 and at a subsequent fabrication stage, a pattern of deep trenches 128 is formed in the substrate 40 by a conventional lithography and subtractive etching process. To that end, a photoresist 130 is applied on pad layer 44 and exposed to a pattern of radiation that, after developing, creates a deep trench pattern. An anisotropic dry etching process, such as reactive-ion etching (RIE) or plasma etching, may then be used to transfer each deep trench 128 from the deep trench pattern in the patterned photoresist 130 into the substrate 40. The deep trench pattern in the photoresist 130 is tailored such that each deep trench 128 is registered with a corresponding one of the shallow trenches 48 overlying the future location of the well junction 142 (FIG. 15).

The damage region 124 (FIG. 13) coinciding with the shallow trench 48 associated with deep trench 128 is partially removed by the anisotropic dry etching process forming the deep trench 128. As a result, sidewalls 127, 129 of the deep trench 128 are each flanked by a corresponding one of a pair of damage regions 132, 134. The deep trench 128 separates damage regions 132, 134 so that the crystalline damage in the semiconductor material of substrate 40 (i.e., the non-monocrystalline semiconductor material) is discontinuous and interrupted across the well junction 142 (FIG. 15). Specifically, a bottom or base 131 of the deep trench 128 is at a greater depth than the damage regions 132, 134. The sidewalls 127, 129 are narrower than the sidewalls 50, 52 of the corresponding shallow trench 48 and the base 131 is at a greater depth, measured perpendicular to surface 41, than base 54 of the corresponding shallow trench 48.

Figure 15:
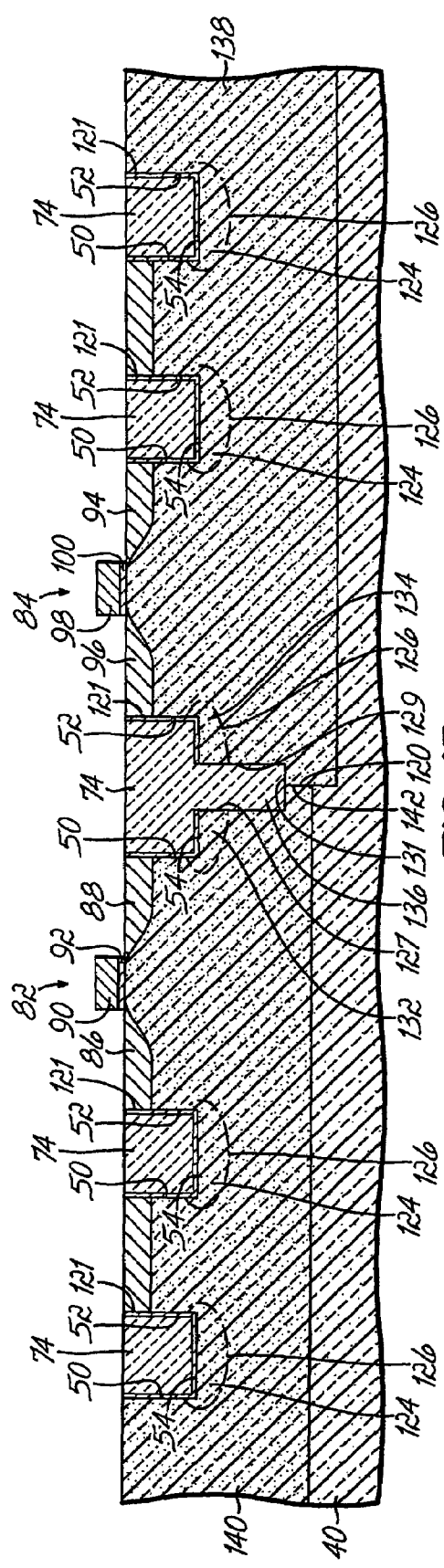

With reference to FIG. 15 in which like reference numerals refer to like features in FIG. 14 and at a subsequent fabrication stage, residual photoresist 130 (FIG. 14) is stripped by, for example, plasma ashing or a chemical stripper after the deep trenches 128 are etched. The shallow trenches 48 are filled with amounts of an insulating or dielectric material, such as HDP oxide or TEOS, deposited across the pad layer 44 and planarized by, for example, a CMP process. The pad structure 42 is removed and planarized to define the STI regions 74 in the substrate 40 by a planarization process that makes the top surface of the STI regions 74 substantially co-planar or flush with the top surface 41 of substrate 40. Portions of the dielectric material also fill the deep trench 128 to define a pigtail or extension 136 that separates the damage regions 132, 134. Standard bulk CMOS processing follows as described above with regard to FIG. 6 to form N- and P-wells 138, 140, similar to N- and P-wells 76, 78 (FIG. 6), the N-channel transistor 82, the P-channel transistor 84, and contacts 102, 104 in the substrate 40. A person having ordinary skill in the art will appreciate that this embodiment of the present invention may be advantageously implemented in a triple-well CMOS structure that includes an N-band (not shown) similar to N-band 80 (FIG. 6).

Figure 16:
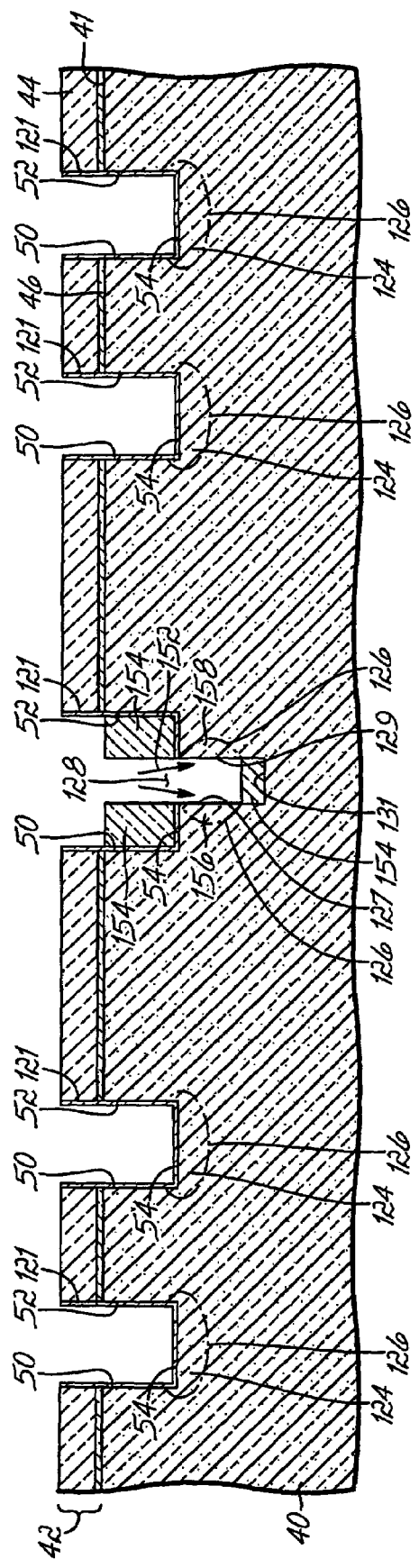
FIG. 16 is a diagrammatic view similar to FIG. 14 depicting a portion of a substrate at a fabrication stage of a processing method in accordance with an alternative embodiment of the present invention.

The selectively introduced lattice damage reduces the current gains of the parasitic NPN and PNP structures 22, 26 (FIG. 1) without degrading well leakage of the N- and P-wells 138, 140. Ordinarily, crystal damage across well junction 142 between the N- and P-wells 138, 140 causes a depletion region in a dual-well bulk CMOS technology, which increases the well leakage currents. In accordance with the present invention, the relatively narrow deep trench 128 is aligned relative to the corresponding shallow trench 48 to intersect the well junction 142 between the N-well 138 and P-well 140, thus removing the damaged semiconductor material across the well junction 142. Thus, the damage in damage regions 132, 134 exists only within the portion of the N- and P-wells 138, 140 that constitutes the base of the parasitic NPN and PNP structures 22, 26 (FIG. 1). The crystal damage in the base regions shortens the minority carrier lifetime of the carriers emitted by the emitters and, thereby, reduces the bipolar gain to the point where latch-up is not sustained. Because the damage is located away from the well junction 142, well leakage is not degraded. With reference to FIG. 16 in which like reference numerals refer to like features in FIG. 14 and in accordance with an alternative embodiment of the present invention, ions 152, similar or identical to ions 122 (FIG. 13), may be directed into the sidewalls 127, 129 of the deep trench 128. An implantation mask 154 of, for example, HDP oxide is applied to self align the impinging ions 152 to the sidewalls 127, 129 and to prevent impinging ions 152 from entering the semiconductor material of the substrate 40 near the base 131 of the deep trench 128. A portion of the implantation mask 154 masks the base 131 of the deep trench 128, which prevents damage to the well junction 142. The implanted ions 152 form damage regions 156, 158 in the semiconductor material of substrate 40 that are similar or identical to damage regions 132, 134 (FIG. 14). These damage regions 156, 158 of non-monocrystalline semiconductor material may be used in conjunction with damage regions 132, 134 for suppressing latch-up. Processing continues as shown in FIG. 15 to complete semiconductor structure.

Figure 17:
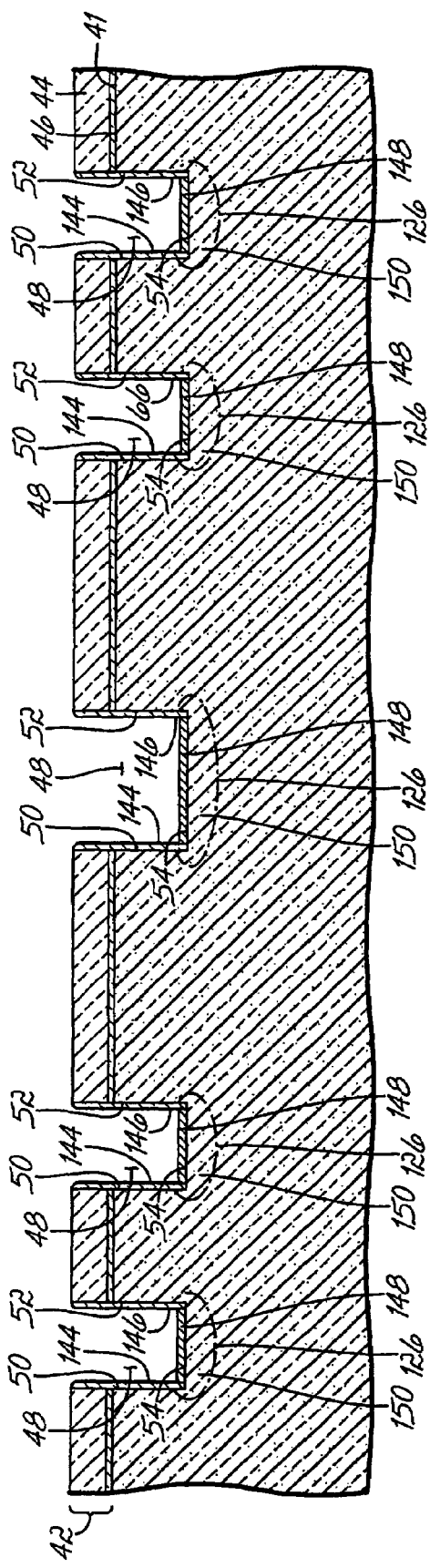
FIG. 17 is a diagrammatic view similar to FIG. 13 depicting a portion of a substrate at a fabrication stage of a processing method in accordance with an alternative embodiment of the present invention.

With reference to FIG. 17 in which like reference numerals refer to like features in FIG. 13 and in accordance with an alternative embodiment of the present invention, a high defect region may be produced near the base 54 of the shallow trenches 48 without ion implantation. To that end, protective spacers 144, 146 of an insulating material, such as silicon oxide or silicon nitride, are formed on the sidewalls 50, 52 of at least the shallow trench 48 that, after subsequent fabrication stages, intersects the well junction 142.

A layer 148 of a semiconductor material, such as SiGe, having a lattice mismatch with the semiconductor material of the substrate 40 is then deposited or grown at the bottom of the shallow trench 48. The protective spacers 144, 146 guard the sidewalls 50, 52 against the formation of an extraneous layer (not shown) of the material constituting layer 148 on sidewalls 50, 52. The lattice mismatch or crystal lattice constant difference between the materials in layer 148 and substrate 40 results in a region 150 of high carrier recombination velocity in the substrate 40 beneath the shallow trench 48. Region 150 is characterized by a high recombination velocity and getters or attracts carriers in transit to the collectors of the parasitic NPN and PNP structures 22, 26 (FIG. 1). Processing continues as shown in FIG. 14 to complete the semiconductor structure (FIG. 15).

Figure 18:
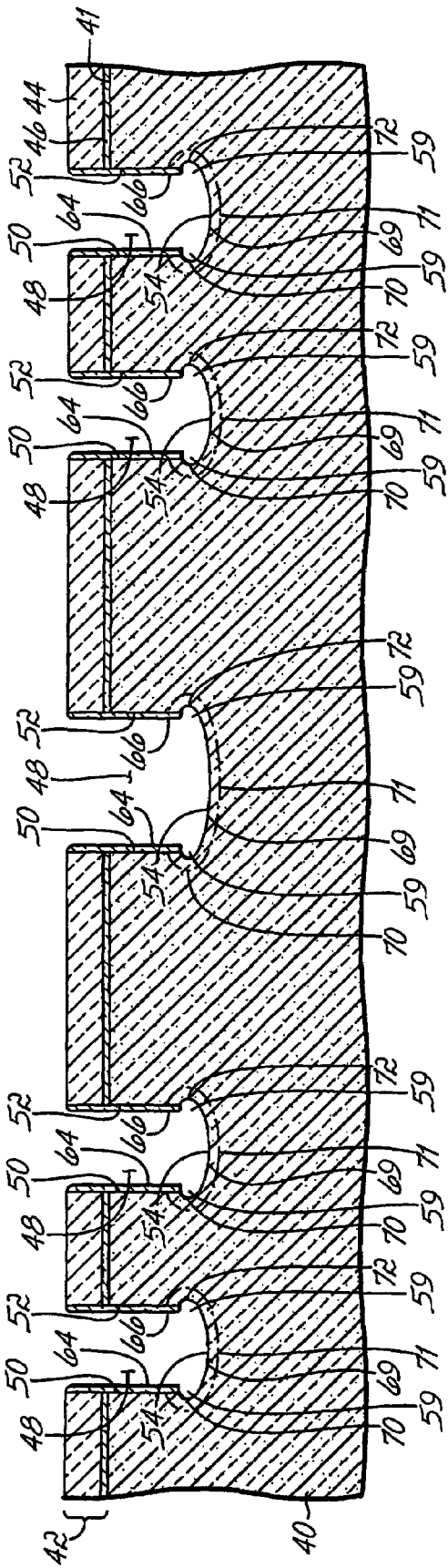
FIG. 18 is a diagrammatic view similar to FIG. 3 depicting a portion of a substrate at a fabrication stage of a processing method in accordance with an alternative embodiment of the present invention.

With reference to FIG. 18 in which like reference numerals refer to like features in FIG. 3 and in accordance with an alternative embodiment of the present invention, the oxygen implanted regions 58 (FIG. 3) may be removed with an appropriate isotropic etching process to leave open cavities or voids 59. The open voids 59, which communicate with a corresponding one of the shallow trenches 48, are each filled with dielectric material when the shallow trenches 48 are filled. The dielectric-filled open voids 59 define the lateral extensions 73, 75 (FIG. 4). Processing continues as shown in FIG. 4 to complete the semiconductor structure.

References herein to terms such as "vertical", "horizontal", etc. are made by way of example, and not by way of limitation, to establish a frame of reference. The term "horizontal" as used herein is defined as a plane parallel to the top surface 41 of substrate 40, regardless of its actual spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor structure comprising:
   a substrate of a semiconductor material having a top surface;
   a first doped well formed in the semiconductor material of the substrate, the first doped well having a first conductivity type;
   a first field effect transistor with source and drain regions in the first doped well;
   a second doped well formed in the semiconductor material of the substrate and disposed adjacent to the first doped well, the second doped well having a second conductivity type;
   a second field effect transistor with source and drain regions in the second doped well; and
   a dielectric-filled trench defined in the substrate between the first and second doped wells, the trench including a base, first sidewalls intersecting the top surface, and second sidewalls disposed between the base and the first sidewalls, the second sidewalls having a wider separation than the first sidewalls, and the wider separation of the second sidewalls operating to reduce latch-up of the first and second field effect transistors.

2. A semiconductor structure comprising:
   a substrate of a semiconductor material having a top surface;
   a first doped well formed in the semiconductor material of the substrate;
   a second doped well formed in the semiconductor material of the substrate and disposed adjacent to the first doped well; and
   a dielectric-filled trench defined in the substrate between the first and second doped wells, the trench including a base, first sidewalls intersecting the top surface, and second sidewalls disposed between the base and the first sidewalls, the second sidewalls having a wider separation than the first sidewalls,
   wherein the semiconductor material of the substrate is monocrystalline, and the semiconductor material of the substrate bordering the second sidewalls and the base includes a damage region of non-monocrystalline semiconductor material.

3. A semiconductor structure comprising:
   a substrate of a semiconductor material having a top surface;
   a first doped well formed in the semiconductor material of the substrate;
   a second doped well formed in the semiconductor material of the substrate and disposed adjacent to the first doped well, the first doped well and the second doped well having a first conductivity type;
   a third doped well formed in the semiconductor material of the substrate, the third doped well arranged between the first doped well and the top surface, the third doped well having a second conductivity type that differs from the first conductivity type; and
   a dielectric-filled trench defined in the substrate between the first and second doped wells, the trench including a base, first sidewalls intersecting the top surface, and second sidewalls disposed between the base and the first sidewalls, the second sidewalls having a wider separation than the first sidewalls.

4. The semiconductor structure of claim 3 further comprising:
   a first field effect transistor with source and drain regions in the first doped well; and
   a second field effect transistor with source and drain regions in the third doped well, the wider separation of the second sidewalls operating to reduce latch-up of the first and second field effect transistors.

5. The semiconductor structure of claim 4 wherein the first and second doped wells have an n-type conductivity, the third doped well has a p-type conductivity, the source and drain regions of the first field effect transistor comprises p-type diffusions, and the source and drain regions of the second field effect transistor comprise n-type diffusions.

6. A semiconductor structure comprising:
   a substrate comprising a monocrystalline semiconductor material having a top surface;
   a first doped well formed in the semiconductor material of the substrate;
   a second doped well formed in the semiconductor material of the substrate and disposed adjacent to the first doped well along a well junction; and
   a dielectric-filled trench defined in the substrate between the first and second doped wells, the trench including a base, first sidewalls intersecting the top surface, and second sidewalls extending from the base to the first sidewalls, the second sidewalls having a narrower separation than the first sidewalls, wherein the semiconductor material of the substrate bordering the second sidewalls includes a damage region comprising non-monocrystalline semiconductor material and the base of the trench is at a greater depth than the damage region for interrupting the continuity of the non-monocrystalline semiconductor material across the well junction.

7. A semiconductor structure comprising:
   a substrate of a first material characterized by semiconducting properties and having a top surface;
   a first doped well formed in the substrate;
   a second doped well formed in the first material of the substrate and disposed adjacent to the first doped well;
   a trench defined in the substrate between the first and second doped wells, the trench including a base and sidewalls intersecting the top surface;
   a dielectric material filler in the trench; and
   a layer of a second material disposed between the first material at the base of the trench and the dielectric material filler, the first and second materials having a crystal lattice constant difference sufficient to increase carrier recombination velocity.

8. The semiconductor structure of claim 7 wherein the first material comprises silicon and the second material comprises an alloy of silicon and germanium.

* * * * *